US009437775B2

(12) United States Patent
Takeuchi et al.

(10) Patent No.: US 9,437,775 B2
(45) Date of Patent: Sep. 6, 2016

(54) NITRIDE SEMICONDUCTOR LIGHT-EMITTING DEVICE

(71) Applicant: MEIJO UNIVERSITY, Nagoya-shi, Aichi (JP)

(72) Inventors: Tetsuya Takeuchi, Nagoya (JP); Motoaki Iwaya, Nagoya (JP); Isamu Akasaki, Nagoya (JP)

(73) Assignee: MEIJO UNIVERSITY, Nagoya-Shi, Aichi (JP)

( * ) Notice: Subject to any disclaimer, the term of this patent is extended or adjusted under 35 U.S.C. 154(b) by 0 days.

(21) Appl. No.: 14/899,364

(22) PCT Filed: Jun. 16, 2014

(86) PCT No.: PCT/JP2014/065893
§ 371 (c)(1),
(2) Date: Dec. 17, 2015

(87) PCT Pub. No.: WO2014/203856
PCT Pub. Date: Dec. 24, 2014

(65) Prior Publication Data
US 2016/0149078 A1 May 26, 2016

(30) Foreign Application Priority Data
Jun. 18, 2013 (JP) ................... 2013-127556

(51) Int. Cl.
*H01L 33/00* (2010.01)
*H01S 5/00* (2006.01)
(Continued)

(52) U.S. Cl.
CPC ............ *H01L 33/145* (2013.01); *H01L 33/06* (2013.01); *H01L 33/18* (2013.01); *H01L 33/32* (2013.01);
(Continued)

(58) Field of Classification Search
CPC ...... H01L 33/32; H01L 33/06; H01L 33/145; H01L 33/18; H01L 33/007; H01L 33/075; H01S 5/3202; H01S 5/34333; H01S 5/3054; H01S 5/3409; H01S 5/341
See application file for complete search history.

(56) References Cited

U.S. PATENT DOCUMENTS

2006/0273329 A1  12/2006  Ohta et al.
2007/0290230 A1  12/2007  Kawaguchi et al.
(Continued)

FOREIGN PATENT DOCUMENTS

JP    2006-245165 A    9/2006
JP    2006-344689 A   12/2006
(Continued)

OTHER PUBLICATIONS

International Search Report for PCT/JP2014/065893, dated Sep. 9, 2014 in English & Japanese Language.
(Continued)

*Primary Examiner* — Nikolay Yushin
(74) *Attorney, Agent, or Firm* — Smith, Gambrell & Russell, LLP

(57) ABSTRACT

An object is to improve a positive hole injection efficiency into an active layer in a nitride semiconductor light-emitting device. The nitride semiconductor light-emitting device is formed by stacking nitride semiconductor crystals each of which contains Al and has a polar or semipolar surface either serving as a growth face. The device includes an active layer (103), and first and second composition-graded layers (102, 104). The active layer (103) is interposed between the first and second composition-graded layers (102, 104). Each one of the first and second composition-graded layers is composition-graded so that an Al composition value is rendered smaller as each one of the first and second composition-graded layers (102, 104) comes close to a side where a sum of spontaneous polarization and piezoelectric polarization is negative.

8 Claims, 6 Drawing Sheets

(51) Int. Cl.
  *H01L 33/14* (2010.01)
  *H01S 5/32* (2006.01)
  *H01S 5/343* (2006.01)
  *H01L 33/06* (2010.01)
  *H01L 33/18* (2010.01)
  *H01L 33/32* (2010.01)
  *H01S 5/30* (2006.01)
  *H01S 5/34* (2006.01)

(52) U.S. Cl.
  CPC ......... *H01S 5/3202* (2013.01); *H01S 5/34333* (2013.01); *H01S 5/3054* (2013.01); *H01S 5/3409* (2013.01)

(56) References Cited

U.S. PATENT DOCUMENTS

2008/0237571 A1  10/2008  Komada
2011/0272670 A1  11/2011  Kawaguchi et al.
2013/0223463 A1   8/2013  Kawaguchi et al.

FOREIGN PATENT DOCUMENTS

JP   2008-244307 A   10/2008
JP   2012-146847 A    8/2012
WO   2005/034301 A1   4/2005
WO   2012/059848 A2   5/2012

OTHER PUBLICATIONS

Shibin Li, et al., Polarization induced pn-junction without dopant in graded AlGaN coherently strained on GaN, Applied Physics Letter, Sep. 18, 2012, vol. 101, p. 122103.

NITRIDE SEMICONDUCTOR LIGHT-EMITTING DEVICE

TECHNICAL FIELD

The present invention relates to a nitride semiconductor light-emitting device.

BACKGROUND ART

Nitride semiconductors as represented by nitride gallium (GaN) have a difficulty in obtaining a high concentration of positive holes, and the positive hole mobility is smaller than the electron mobility in the nitride semiconductors. Accordingly, a positive hole injection efficiency into an active layer is required to be improved in order that a current injection type high-efficient light emitting device may be realized. To deal with this problem, there is known a method of obtaining a high positive hole concentration by attracting positive holes using polarization fixed charge which is generated on a crystal interface by spontaneous polarization or piezoelectric polarization each as a physical property inherent in a nitride semiconductor material. However, polarization is caused while positive and negative fixed charges are paired with electrical neutrality being maintained. Accordingly, a nitride semiconductor having a multilayer structure, such as a nitride semiconductor light-emitting device could lead to occurrence of unnecessary polarization fixed charge on an originally unintended interface of the multilayer structure. As a result, a case would occur where current injection into the device may be blocked. This would complicate a device design.

Undermentioned Patent Document 1 discloses a conventional nitride semiconductor device including an active layer and a semiconductor layer having a larger band gap than the active layer. This nitride semiconductor light-emitting device uses as the semiconductor layer a composition-graded layer including an Al composition and an In composition both changed in a thicknesswise direction in order that influences of a polarization field at an interface between the active layer and the semiconductor layer may be reduced. As a result, the influences of the polarization field is reduced at the interface between the active layer and the semiconductor layer, so that the carrier injection efficiency into the active layer can be improved.

PRIOR ART DOCUMENT

Patent Documents

Patent Document 1: Japanese Patent Application Publication No. JP-A-2006-245165

SUMMARY OF THE INVENTION

Problem to Be Overcome By the Invention

However, this nitride semiconductor light-emitting device has room for improvement in the positive hole injection efficiency into the active layer by increasing the positive hole concentration in the vicinity of the active layer in a case where it is possible to appropriately control both the polarization fixed charge generated at the interface of the multilayer structure of the light-emitting device and inside the layers and doping concentrations of impurities.

The present invention was made in view of the above-described circumstances of the conventional art and an object thereof is to realize a nitride semiconductor light-emitting device in which the positive hole injection efficiency into the active layer can be improved.

Means for Overcoming the Problem

A nitride semiconductor light-emitting device in accordance with the invention, which is formed by stacking nitride semiconductor crystals in a +c-axis direction each one of which contains Al and has a polar face or a semipolar face either serving as a growth face, includes an active layer, a first composition-graded layer and a second composition-graded layer. In the device, the active layer is interposed between the first and second composition-graded layers. Each one of the first and second composition-graded layers is composition-graded so that an Al composition value thereof is rendered smaller as each one of the first and second composition-graded layers comes close to a side where a sum of spontaneous polarization and piezoelectric polarization is negative. The first composition-graded layer has a first interface between the active layer and the first composition-graded layer and a second interface away from the first interface, and the first interface has a larger Al composition value than the second interface. The second composition-graded layer has a third interface between the active layer and the second composition-graded layer and a fourth interface away from the third interface, and the fourth interface has a smaller Al composition value than the third interface.

The active layer is interposed between the first and second composition-graded layers in this nitride semiconductor light-emitting device. Furthermore, each one of the first and second composition-graded layers is composition-graded so that an Al composition value thereof is rendered smaller as each one of the first and second composition-graded layers comes close to a side where a sum of spontaneous polarization and piezoelectric polarization is negative. Accordingly, of the polarization fixed charges in the first and second composition-graded layers, negative polarization fixed charges are averaged to be distributed in a thicknesswise direction. Since the negative polarization fixed charges attract positive holes, the positive hole concentrations are increased in the first and second composition-graded layers respectively, with the result that p-type regions are effectively formed in each one of the first and second composition-graded layers. Since the active layer is interposed between the first and second composition-graded layers both having become respective p-type regions, the injection efficiency of positive holes into the active layer can be improved. Consequently, the current injection efficiency can be improved in the nitride semiconductor light-emitting device.

MODE FOR CARRYING OUT THE INVENTION

Figure 1:
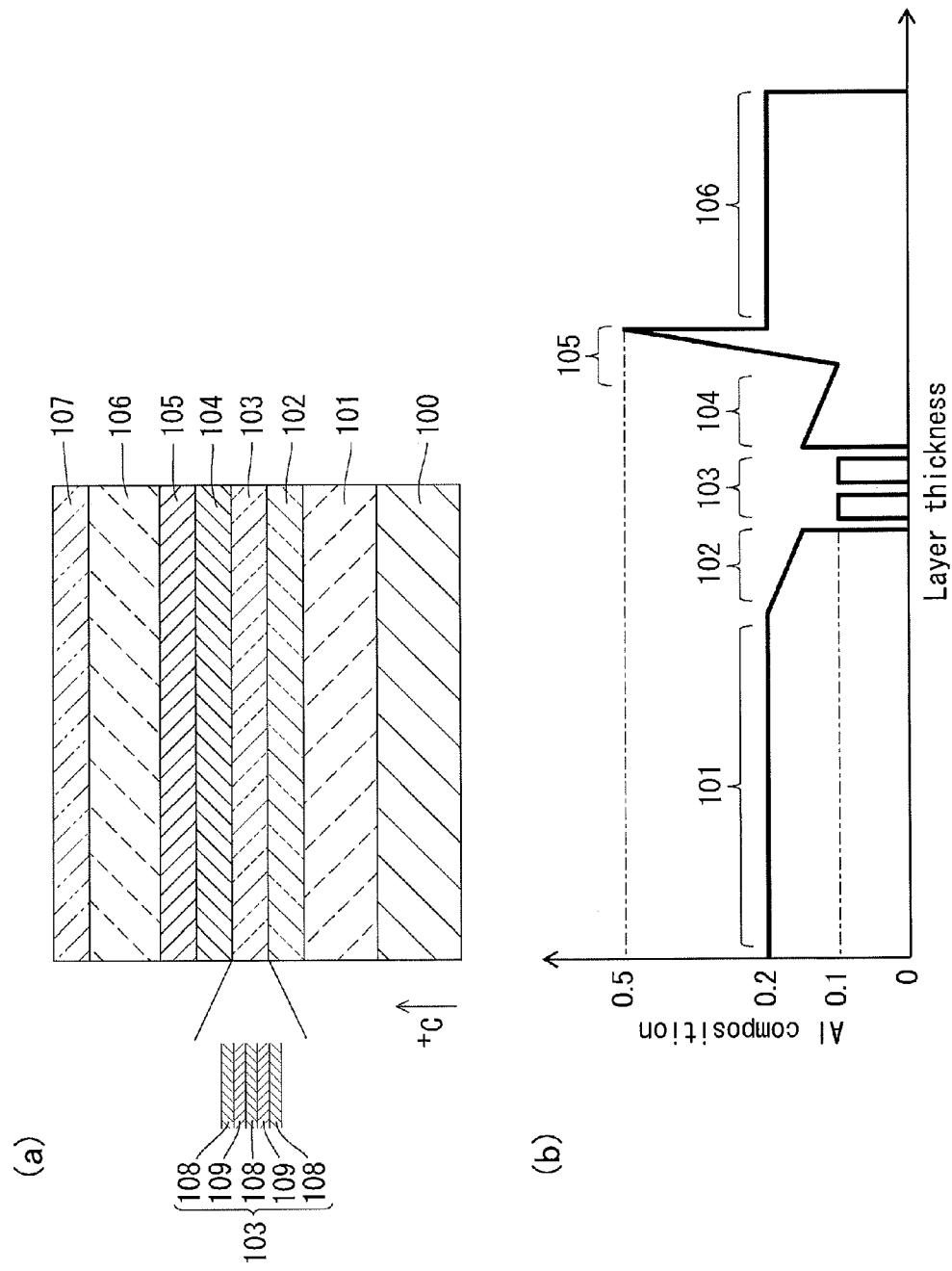
FIGS. 1(a) and 1(b) area sectional view of an ultraviolet laser diode of a first embodiment and a graph showing a profile of Al composition in the layers of the ultraviolet laser diode, respectively.

Preferred embodiments of the invention will be described.

(1) The nitride semiconductor light-emitting device according to the invention may further include a p-type electron blocking layer disposed to be adjacent to the first or second composition-graded layer. The p-type electron blocking layer may further be disposed to be adjacent to the side where the Al composition value is reduced. A p-type impurity may be doped into the p-type electron blocking layer while the p-type electron blocking layer contains Al. The p-type electron blocking layer may be composition-graded so that an Al composition value thereof is rendered larger as the p-type electron blocking layer comes close to a side which is parted away from the active layer. The Al composition value of the p-type electron blocking layer may have a maximum value which is larger than the Al composition values of the first and second composition-graded layers.

According to the above-described configuration, of polarization fixed charges in the p-type electron blocking layer adjacent to the first or second composition-graded layer, the positive fixed charges are averaged. Here, by doping the p-type impurity, a p-type region is formed to be continuous to the first or second composition-graded layer. As a result, the positive hole injection efficiency into the active layer can further be improved. Furthermore, since the maximum Al composition value of the p-type electron blocking layer is larger than the Al composition values of the first and second composition-graded layers, overflow of electrons from the active layer can effectively be reduced.

(2) In the nitride semiconductor light-emitting device according to the invention, the first and second composition-graded layers may have respective Al composition values at interfaces between each composition-graded layer and the active layer, and the Al composition values may substantially be equal to each other.

According to this configuration, since there is no band offset between the first and second composition-graded layers, the nitride semiconductor light-emitting device can reduce an unintentional occurrence of polarization fixed charges at interfaces between each composition-graded layer and the active layer. With this, the polarization fixed changes are averaged in the first and second composition-graded layers, with the result that the design of the light-emitting device can be rendered easier.

(3) In the nitride semiconductor light-emitting device according to the invention, the growth face may be a c-plane.

According to this configuration, the growth can more easily be controlled and the crystallinity can be rendered better by employing the c-plane as the growth face and by stacking the nitride semiconductor crystals in the +c-axis direction. Furthermore, since the c-plane is a polar face, the polarization effect can be utilized to the maximum extent possible.

(4) In the nitride semiconductor light-emitting device according to the invention, the first and second composition-graded layers may be AlGaN layers.

According to this configuration, the composition control can be rendered easier and the crystallinity can be rendered better.

A first embodiment of the nitride semiconductor light-emitting device in accordance with the invention will be described with reference to the drawings.

First Embodiment

FIGS. 1(a) and 1(b) show a sectional structure of an ultraviolet (UV) laser diode according to the first embodiment and an Al composition profile of layers of the laser diode, respectively. The UV laser diode includes a triple quantum well active layer (an active layer) 103 further including GaN quantum well layers 108 and $Al_{0.1}Ga_{0.9}N$ barrier layers 109, and first and second AlGaN composition-graded layers (first and second composition-graded layers) 102 and 104 at both sides of the triple quantum well active layer 103 in a stacking direction respectively. More specifically, the triple quantum well active layer 103 is interposed between the first and second composition-graded AlGaN layers 102 and 104.

The UV laser diode is formed by stacking, on a c-plane GaN oriented in a +c-axis direction or an AlN polar substrate 100, an n-type $Al_{0.2}Ga_{0.8}N$ clad layer 101, the first composition-graded AlGaN layer 102, the GaN triple quantum well active layer 103, the second composition-graded AlGaN layer 104, a p-type composition-graded AlGaN electron blocking layer (a p-type electron blocking layer) 105, a p-type $Al_{0.2}Ga_{0.8}N$ clad layer 106 and a p-type GaN contact layer 107 sequentially in this order.

The n-type $Al_{0.2}Ga_{0.8}N$ clad layer 101 has a film thickness of 1000 nm, and silicon (Si) serving as an n-type impurity is doped into the clad layer 101 at a concentration of $7\times10^{18}$ $cm^{-3}$. The p-type $Al_{0.2}Ga_{0.8}N$ clad layer 106 has a film thickness of 600 nm, and magnesium (Mg) serving asap-type impurity is doped into the clad layer 106 at a concentration of $3\times10^{19}$ $cm^{-3}$. The p-type GaN contact layer 107 has a film thickness of 50 nm, and Mg is doped into the contact layer 107 at a concentration of $1\times10^{20}$ $cm^{-3}$.

The GaN triple quantum well active later 103 is formed by stacking 2.5 pairs of the GaN quantum well layers 108 each of which has a film thickness of 3 nm and $Al_{0.8}Ga_{0.9}N$ barrier layers 109 each of which has a film thickness of 8 nm.

The first composition-graded AlGaN layer 102 has a film thickness set to 100 nm and is composition-graded so that an Al composition value thereof is reduced from 0.2 to 0.15 in a stacking direction in a linear manner, as shown in FIG.

1(b). The n-type $Al_{0.2}Ga_{0.8}N$ clad layer 101 and the first composition-graded AlGaN layer 102 have respective Al composition values at an interface therebetween, and the Al composition values are equal to each other. The second composition-graded AlGaN layer 104 has a film thickness of 100 nm, which is the same value as the first composition-graded AlGaN layer 102. The second composition-graded AlGaN layer 104 is composition-graded so that an Al composition value thereof is reduced from 0.15 to 0.1 in a stacking direction in a linear manner, as shown in FIG. 1(b). Interfaces between the first and second composition-graded AlGaN layers 102 and 104 and the GaN triple quantum well active layer 103 have respective Al composition values set to the same value of 0.15. Furthermore, no impurity is doped into the first and second composition-graded AlGaN layers 102 and 104 (more specifically, the AlGaN layers are undoped).

The p-type composition-graded AlGaN electron blocking layer 105 has a film thickness of 20 nm, and Mg is doped into the blocking layer 105 at a concentration of $5 \times 10^{19}$ $cm^{-3}$. The p-type composition-graded AlGaN electron blocking layer 105 is composition-graded so that an Al composition value thereof is increased from 0.1 to 0.5 in a stacking direction in a linear manner, as shown in FIG. 1(b). Furthermore, the second composition-graded AlGaN layer 104 and the p-type composition-graded AlGaN electron blocking layer 105 have respective Al composition values at an interface therebetween, which values are set to the same value of 0.1.

Figure 2:
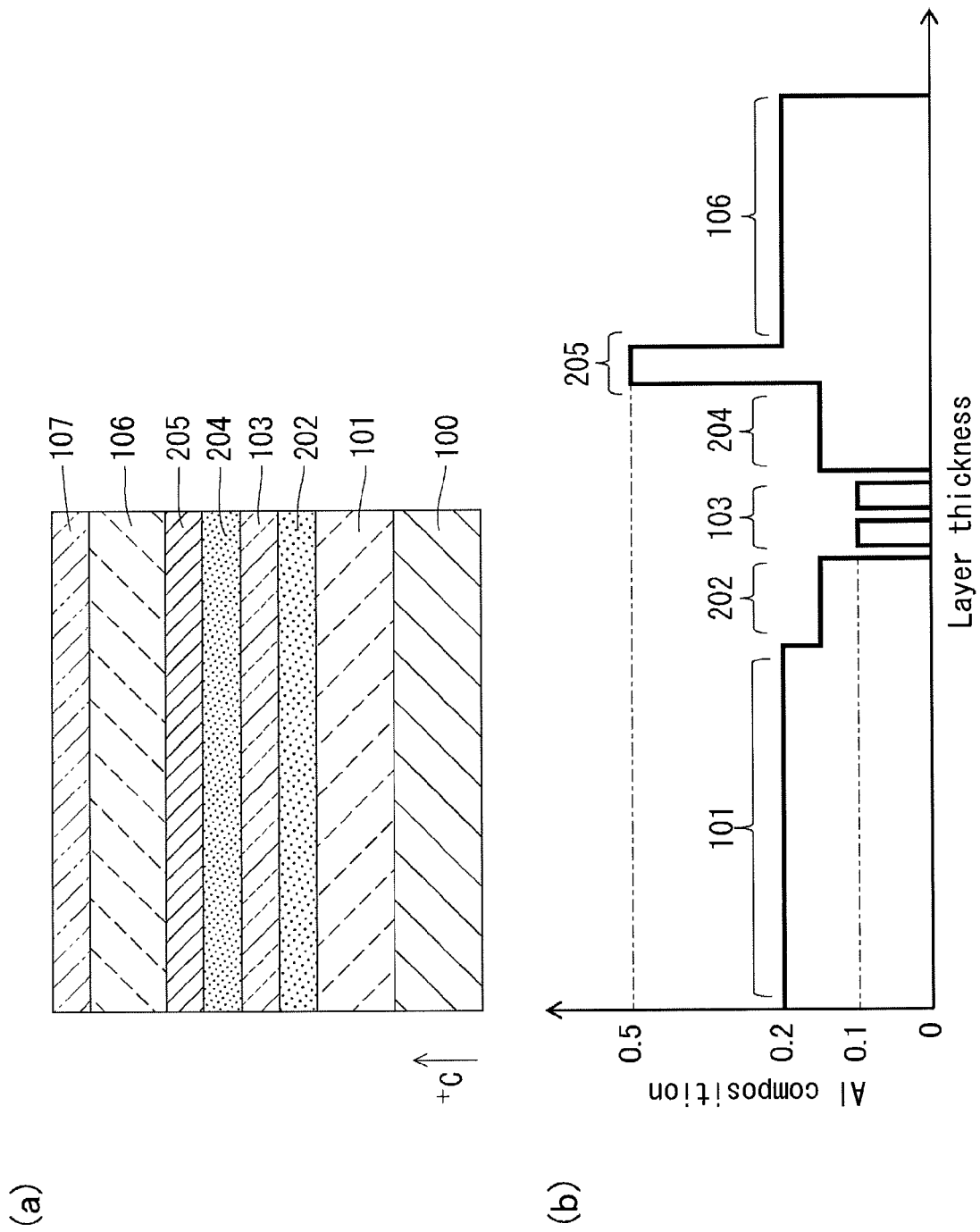
FIGS. 2(a) and 2(b) are a sectional view of an ultraviolet laser diode of a comparative example and a graph showing a profile of Al composition in the layers of the ultraviolet laser diode, respectively.

A UV laser diode composed of layers having a uniform composition is configured as a comparative example as follows. FIGS. 2(a) and 2(b) show a sectional structure and an Al composition profile of the layers respectively. The comparative example differs from the first embodiment in that the first and second composition-graded AlGaN layers 102 and 104 are replaced by first and second AlGaN layers 202 and 204 having a uniform Al composition. Furthermore, the p-type composition-graded AlGaN electron blocking layer 105 is also replaced by a p-type AlGaN electron blocking layer 205 having a uniform Al composition.

The Al composition values of the first and second AlGaN layers 202 and 204 are set to 0.15. The Al composition value of the p-type AlGaN electron blocking layer 205 is set to 0.5. This results in new offsets (discontinuities) of the Al composition value at an interface between the n-type $Al_{0.2}Ga_{0.8}N$ clad layer 101 and the first AlGaN layer 202 and at an interface between the second AlGaN layer 204 and the p-type AlGaN electron blocking layer 205, as shown in FIG. 2(b).

Figure 3:
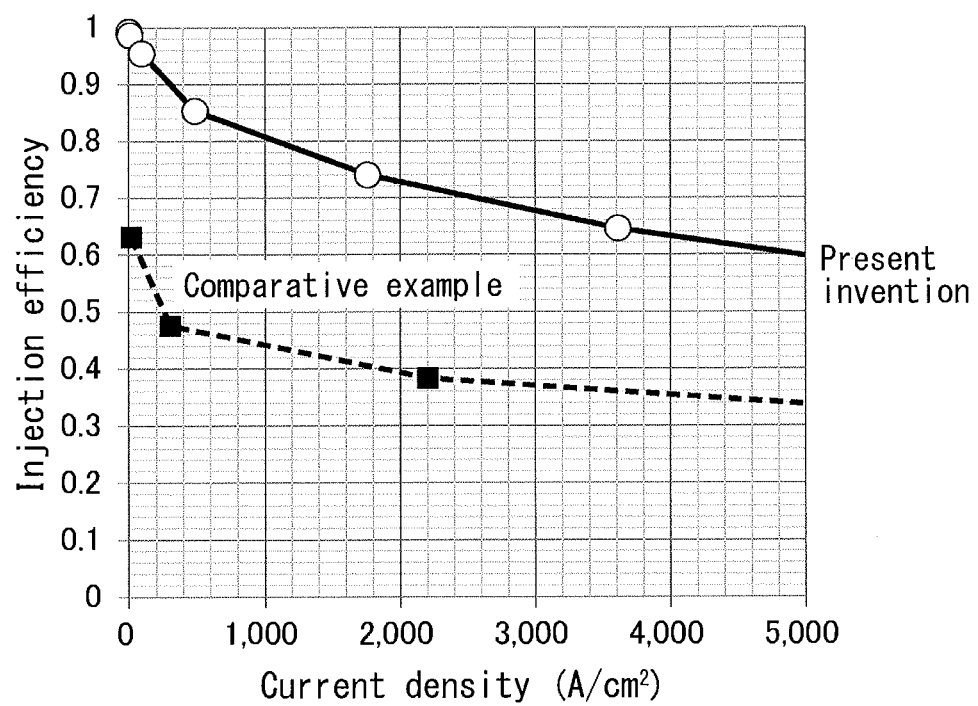
FIG. 3 is a graph showing results of calculation to obtain current injection efficiency dependency on the current density in the first embodiment and the comparative example.

Next, FIG. 3 shows the results of calculation to obtain current injection efficiencies into the GaN triple quantum well active layers 103 in the UV laser diodes of the first embodiment and the comparative example respectively. In FIG. 3, a vertical axis represents a current injection efficiency and a horizontal axis represents a density (A/c $m^2$) of current injected. As understood from FIG. 3, it can be found that the UV laser diode of the first embodiment obtains a higher current injection efficiency than the UV laser diode of the comparative example, irrespective of the current density values.

The working of the embodiment will be described.

FIGS. 4(a) to 4(d) show the relationship between the layer structure and the carrier density in the UV laser diode of the first embodiment. FIGS. 4(a) to 4(d) show only the n-type $Al_{0.2}Ga_{0.8}N$ clad layer 101, the first composition-graded AlGaN layer 102, the GaN triple quantum well active layer 103, the second composition-graded AlGaN layer 104 and the p-type composition-graded AlGaN electron blocking layer 105 of the device structure. When AlGaN with a uniform Al composition is grown in the +c-axis direction, a positive polarization fixed charge is generated at an interface at the −c-axis side (a nitrogen surface side). A negative polarization fixed charge is also generated at an interface at the +c-axis side (a group III element surface side). Furthermore, when AlGaN having an Al composition value and composition-graded in a stacking direction is grown in the +c-axis direction, a positive polarization fixed charge is generated at the interface at the −c-axis side. Furthermore, a negative polarization fixed charge is generated in an averaged state in the layer as well as at the interface at the +c-axis side. Additionally, the caused polarization forms a set of fixed charges which are charged oppositely to each other and are equal in magnitude.

Figure 4:
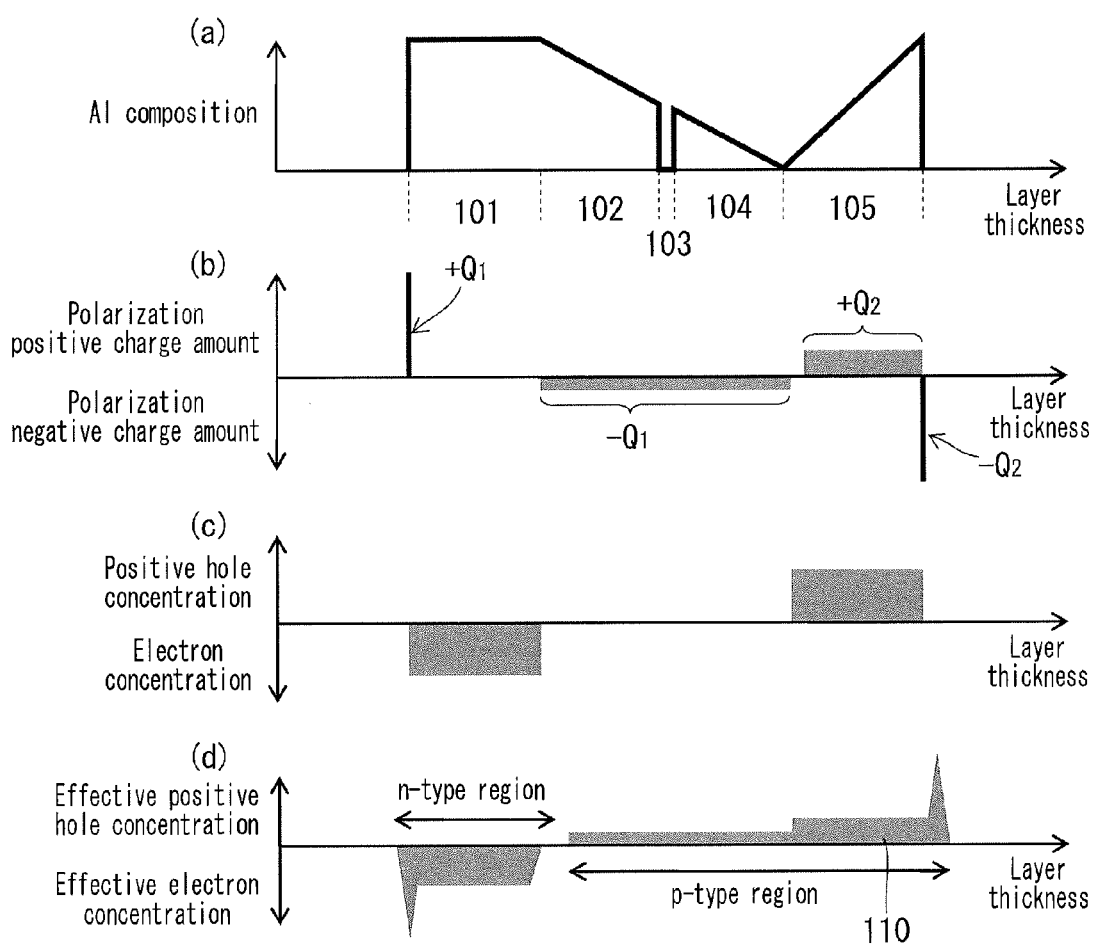
FIGS. 4(a) to 4(d) are graphs showing the relationship between the layer structure and carrier concentration distribution of the ultraviolet laser diode of the first embodiment, including (a) a graph showing the relationship between the Al composition and the layer thickness, (b) a graph showing the relationship between an amount of polarization fixed charge and a layer thickness, (c) a graph showing the relationship between the carrier concentration with impurity doping and the layer, thickness and (d) a graph showing the relationship between an effective carrier concentration and the layer thickness, respectively.
Figure 5:
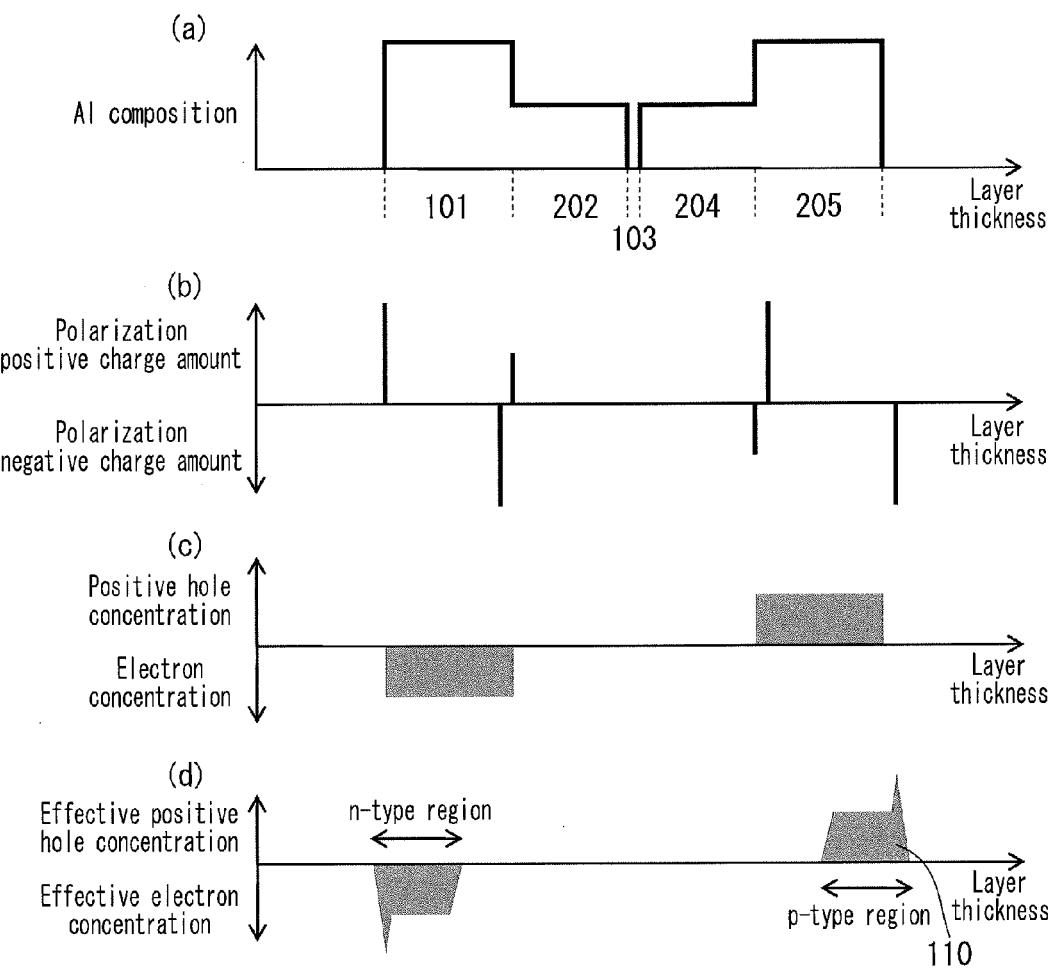
FIGS. 5(a) to 5(d) are graphs showing the relationship between the layer structure and carrier concentration distribution of the ultraviolet laser diode according to the comparative example, including (a) a graph showing the relationship between the Al composition and the layer thickness, (b) a graph showing the relationship between an amount of polarization fixed charge and a layer thickness, (c) a graph showing the relationship between the carrier concentration with impurity doping and the layer, thickness and (d) a graph showing the relationship between an effective carrier concentration and the layer thickness, respectively.

When the foregoing is taken into consideration, the polarization charge distribution in each one of the layer structures in FIGS. 4(a) to 4(d) is considered to be shown in FIG. 4(b). More specifically, a polarization fixed charge is steeply generated at an interface at the side opposed to the n-type $Al_{0.2}Ga_{0.8}N$ clad layer 101 in a layer direction. Negative polarization charges uniformly distributing in the layer direction are generated in the first and second composition-graded AlGaN layers 102 and 104. A positive polarization fixed charge uniformly distributing in the layer direction is also generated in the p-type composition-graded AlGaN electron blocking layer 105, and a negative polarization fixed charge is steeply generated at an interface at the side in the stacking direction. The positive polarization fixed charge amount +Q1 is equal to a sum −Q1 of negative polarization fixed charges in the layer (FIG. 4(b)). In the same manner, the negative polarization fixed charge amount −Q2 is equal to a sum +Q2 of positive polarization fixed charges in the layer (FIG. 4(b)).

Next, regarding the carrier concentration due to impurity doping, carriers are distributed in the layers as shown in FIG. 4(c). More specifically, a specific amount of electrons is distributed in the n-type $Al_{0.2}Ga_{0.8}N$ clad layer 101, and a specific amount of positive holes is distributed in the p-type composition-graded AlGaN electron blocking layer 105. Since no impurity is doped into the first and second composition-graded AlGaN layers 102 and 104 and the GaN triple quantum well active layer 103, carriers are not distributed in these layers.

The difference is obtained by subtracting the fixed charge due to polarization as shown in FIG. 4(b) from a carrier concentration resulting from impurity as shown in FIG. 4(c). Since a polarization charge attracts free carriers having a reverse-signed charge under charge neutralization conditions, the aforesaid difference is considered to be an effective concentration of carriers formed in each layer (FIG. 4(d)). As understood from FIG. 4(d), a p-type region 110 in which positive holes exist is formed to extend from the first composition-graded AlGaN layer 102 to the p-type composition-graded AlGaN electron blocking layer 105. Thus, the positive holes also exist in the vicinity of the GaN triple quantum well active layer 103 provided between the first and second composition-graded AlGaN layers 102 and 104.

FIGS. 5(a) to 5(d) show the relationship between the layer structure and the carrier density in the UV laser diode of the comparative example. Since no composition-graded layers are provided in the layer structure of the comparative example, polarization fixed charges are generated only at the interfaces between the layers (FIG. 5(c)). Accordingly, the p-type region in which positive holes exist does not extend in the vicinity of the GaN triple quantum well active layer 103 (FIG. 5(d)).

A positive hole has a small mobility in nitride semiconductors since an effective mass of the positive hole is large. Furthermore, since a diffusion length of the positive holes is short, the positive holes are less likely to reach the GaN triple quantum well active layer 103 even when voltage is applied for prompt of current injection. However, a specific amount of positive holes exists in the vicinity of the GaN triple quantum well active layer 103 in the UV laser diode of the first embodiment. Accordingly, an injection efficiency of the positive hole into the GaN triple quantum well active layer 103 is improved as compared with that of the comparative example. This leads to an improvement in the current injection efficiency as shown in FIG. 3.

Figure 6:
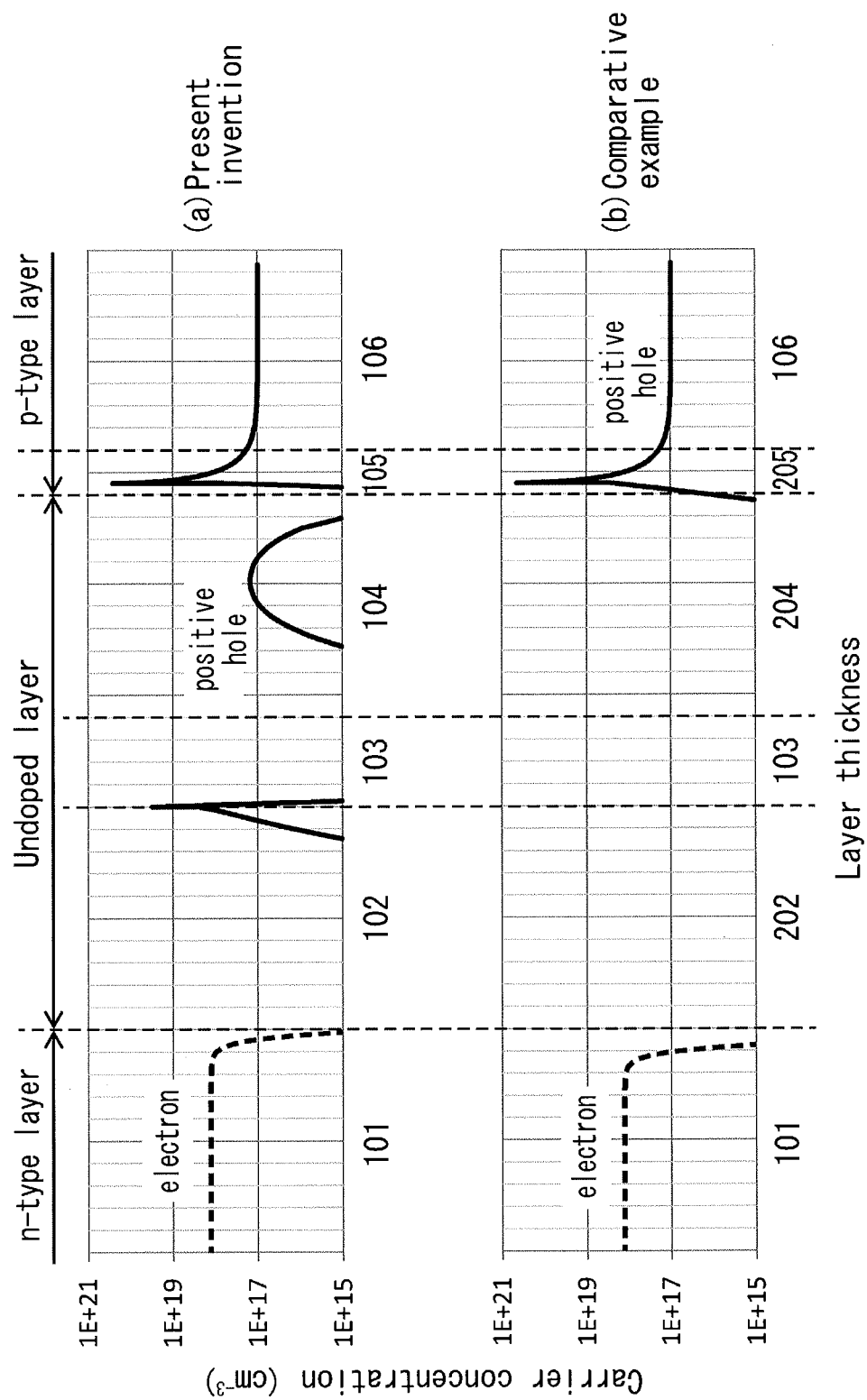
FIGS. 6(a) and 6(b) are graphs showing the relationship between the layer structure and calculation results of carrier concentration distribution of the first embodiment and the comparative example, respectively.

The foregoing description is based on the graphs and does not take into consideration generation of polarization charges at the interfaces between the first and second composition-graded AlGaN layers 102 and 104 and the GaN triple quantum well active layer 103, and the like. FIGS. 6(a) and 6(b) show the results of calculation carried out to obtain an effective carrier concentration distribution in each layer with the generation of polarization charge and the like being taken into actual consideration. As understood from FIG. 6(b), it can be found that no carriers are generated in the first and second AlGaN layers 202 and 204 in the structure of the comparative example. In the structure of the first embodiment, however, positive holes are generated in the vicinity of the GaN triple quantum well active layer 103 and in the second composition-graded AlGaN layer 104 with the result that the p-type region 110 is formed (FIG. 6(a)). The formation of the p-type region 110 leads to an improvement in the current injection efficiency into the GaN triple quantum well active layer 103.

Next, advantageous effects of the first embodiment will be described.

The GaN triple quantum well active layer 103 is disposed between the first and second composition-graded AlGaN layers 102 and 104 which are undoped. Each one of the first and second composition-graded AlGaN layers 102 and 104 is composition-graded so that an Al composition value is rendered smaller as each one of the first and second composition-graded AlGaN layers 102 and 104 comes close to the side where the sum of spontaneous polarization and piezoelectric polarization is negative (in the +c-axis direction). Accordingly, the negative fixed charges of the polarization fixed charges in the first and second composition-graded AlGaN layers 102 and 104 are averaged to be distributed in the layer direction. Since the negative fixed charges attract the positive holes, the positive hole concentration is increased in each of the first and second composition-graded AlGaN layers 102 and 104 with the result that the p-type region 110 large in area in the layer direction is actually formed in each of the first and second composition-graded AlGaN layers 102 and 104. Since the GaN triple quantum well active layer 103 is disposed to be sandwiched between the first and second composition-graded AlGaN layers 102 and 104 which have become the p-type regions 110, the positive hole injection efficiency into the GaN triple quantum well active layer 103 can be improved and the current injection efficiency can also be improved.

The p-type electron blocking layer 105 adjacent to the second composition-graded AlGaN layer 104 is also composition-graded so that the Al composition value thereof is increased in the +c-axis direction in the linear manner. Accordingly, the positive fixed charges of the polarization fixed charges in the p-type electron blocking layer 105 are also averaged in the layer direction. Furthermore, by doping of the p-type impurity, the p-type region 110 is formed in the p-type electron blocking layer 105 continuously with the first and second composition-graded AlGaN layers 102 and 104. This further improves the positive hole injection efficiency into the GaN triple quantum well active layer 103. Furthermore, the maximum Al composition value of the p-type electron blocking layer 105 is 0.5, which value is set to be larger than the maximum Al composition values of the first and second composition-graded AlGaN layers 102 and 104, that is, 0.2. This can effectively suppress overflow of electrons from the active layer 103.

The interfaces between the first and second composition-graded AlGaN layers 102 and 104 and the GaN triple quantum well active layer 103 have respective Al composition values set to the same value of 0.15. As a result, since there is no band offset between the first and second composition-graded layers 102 and 104, unintentional generation of polarization fixed charges can be suppressed at the interfaces between the first and second composition-graded AlGaN layers 102 and 104 and the GaN triple quantum well active layer 103. With this, the polarization fixed charges are further averaged in the layer direction in the first and second composition-graded AlGaN layers 102 and 104, with the result that the design of the light-emitting device can be rendered easier.

According to the present invention, the active layer 103 is disposed between the first and second composition-graded layers 102 and 104 each one of which is formed so that the Al composition value is rendered smaller as each one of the first and second composition-graded layers 102 and 104 comes close to the side where the sum of spontaneous polarization and piezoelectric polarization is negative. Accordingly, the positive hole concentration is increased in each of the first and second composition-graded layers 102 and 104 with the result that the positive hole injection efficiency into the active layer 103 is improved. This leads to an improvement in the current injection efficiency.

Other Embodiments

The invention should not be limited to the foregoing embodiment described above with reference to the accompanying drawings. For example, the technical scope of the invention encompasses the following embodiments.

(1) Although the nitride semiconductor crystals are stacked in the +c-axis direction, the crystals may be stacked from the −c-axis direction, instead.

(2) Although the Al composition values of the composition-graded layers are reduced or increased in the stacking direction in the linear manner in the foregoing embodiment, the Al composition values may be reduced or increased to be upwardly or downwardly convex with respect to the stacking direction, instead.

(3) Although Si and Mg are used as the respective n-type and p-type impurities in the foregoing embodiment, germanium (Ge), zinc (Zn), beryllium (Be) or the like may be used, instead.

(4) Although the GaN triple quantum well layer is used as the active layer in the foregoing embodiment, a nitride semiconductor crystal layer including Al and In may be used depending upon a wavelength of light to be emitted, instead. Furthermore, the number of pairs of the active layers has no limitation.

(5) Although AlGaN is used as the first and second composition-graded layers in the foregoing embodiment, AlN, AlGaInN or AlInN may be used, instead.

(6) Although the Al composition value of the p-type electron blocking layer is composition-graded in the stacking direction in the foregoing embodiment, the Al composition value may not be composition-graded.

(7) Although the UV laser diode is exemplified as the nitride semiconductor light-emitting device in the foregoing embodiment, a surface-emitting laser or a light-emitting diode may be exemplified, instead.

(8) Although the growth face is the c-plane in the foregoing embodiment, the growth face may be a semipolar surface, instead.

(9) Although the first and second composition-graded layers are undoped layers in the foregoing embodiment, impurities may be doped into the first and second composition-graded layers, instead.

EXPLANATION OF REFERENCE SYMBOLS

102 . . . a first composition-graded AlGaN layer (a first composition-graded layer)
103 . . . a GaN triple quantum well active layer (an active layer)
104 . . . a second composition-graded AlGaN layer (a second composition-graded layer)
105 . . . a p-type composition-graded AlGaN electron blocking layer (a p-type electron blocking layer)

The invention claimed is:

1. A nitride semiconductor light-emitting device which is formed by stacking nitride semiconductor crystals in a +c-axis direction, each nitride semiconductor crystal containing Al and having a polar or semipolar surface either serving as a growth face, the device comprising an active layer, a first composition-graded layer and a second composition-graded layer, wherein:
the active layer is interposed between the first and second composition-graded layers; and
each one of the first and second composition-graded layers is composition-graded so that an Al composition value thereof is rendered smaller as each one of the first and second composition-graded layers comes close to a side where a sum of spontaneous polarization and piezoelectric polarization is negative;
the first composition-graded layer has a first interface between the active layer and the first composition-graded layer and a second interface away from the first interface, and the first interface has a larger Al composition value than the second interface; and
the second composition-graded layer has a third interface between the active layer and the second composition-graded layer and a fourth interface away from the third interface and the fourth interface has a smaller Al composition value than the third interface.

2. The device according to claim 1, further comprising a p-type electron blocking layer disposed to be adjacent to the first or second composition-graded layer, the p-type electron blocking layer being further disposed to be adjacent to the side where the Al composition value is reduced, wherein:
a p-type impurity is doped into the p-type electron blocking layer while the p-type electron blocking layer contains Al;
the p-type electron blocking layer is composition-graded so that an Al composition value thereof is rendered larger as the p-type electron blocking layer comes close to a side which is parted away from the active layer; and
the Al composition value of the p-type electron blocking layer has a maximum value which is larger than the Al composition values of the first and second composition-graded layers.

3. The device according to claim 1, wherein the first and second composition-graded layers have respective Al composition values at interfaces between each composition-graded layer and the active layer, the Al composition values being substantially equal to each other.

4. The device according to claim 1, wherein the growth face is a c-plane.

5. The device according to claim 1, wherein the first and second composition-graded layers are AlGaN layers.

6. The device according to claim 2, wherein the first and second composition-graded layers have respective Al composition values at interfaces between each composition-graded layer and the active layer, the Al composition values being substantially equal to each other.

7. The device according to claim 6, wherein the growth face is a c-plane.

8. The device according to claim 7, wherein the first and second composition-graded layers are AlGaN layers.

* * * * *